(12) United States Patent
Hosking

(10) Patent No.: US 7,418,015 B2
(45) Date of Patent: Aug. 26, 2008

(54) SYSTEM AND METHOD FOR CONTROL OF OPTICAL TRANSMITTER

(75) Inventor: Lucy G. Hosking, Santa Cruz, CA (US)

(73) Assignee: Finisar Corporation, Sunnyvale, CA (US)

( * ) Notice: Subject to any disclaimer, the term of this patent is extended or adjusted under 35 U.S.C. 154(b) by 409 days.

(21) Appl. No.: 10/784,565

(22) Filed: Feb. 23, 2004

(65) Prior Publication Data
US 2007/0195840 A1   Aug. 23, 2007

(51) Int. Cl.
*H01S 3/10* (2006.01)
*H01S 3/13* (2006.01)
*H01S 3/00* (2006.01)

(52) U.S. Cl. .................. 372/26; 372/29.01; 372/38.02

(58) Field of Classification Search .................. 372/8, 372/9, 26, 29.01, 32, 38.1, 38.02, 38.07
See application file for complete search history.

(56) References Cited

U.S. PATENT DOCUMENTS

| | | | |
|---|---|---|---|
| 4,918,700 A * | 4/1990 | Gambini ...................... 372/32 |
| 5,268,916 A | 12/1993 | Slawson et al. ................ 372/38 |
| 5,317,443 A | 5/1994 | Nishimoto .................. 359/187 |
| 6,414,974 B1 * | 7/2002 | Russell et al. ............ 372/38.02 |

* cited by examiner

*Primary Examiner*—Armando Rodriguez
(74) *Attorney, Agent, or Firm*—Workman Nydegger

(57) ABSTRACT

A system and method for controlling an optical transmitter. Proximate to startup of the optical transmitter, the laser bias to the optical transmitter is increased from a minimum to a setpoint according to a predefined function. After the laser bias setpoint is reached, the electrical modulation amplitude is increased from a minimum to a setpoint according to a predefined function. Proximate to shutdown of the optical transmitter, the electrical modulation amplitude is decreased from the setpoint to the minimum according to a predefined function. After the electrical modulation amplitude minimum is reached, the laser bias to the optical transmitter is decreased from a setpoint to a minimum according to a predefined function.

28 Claims, 8 Drawing Sheets

SYSTEM AND METHOD FOR CONTROL OF OPTICAL TRANSMITTER

RELATED APPLICATIONS

Not applicable.

BACKGROUND OF THE INVENTION

1. Field of the Invention

The present invention relates generally to optical transmitters and associated control systems. More particularly, embodiments of the present invention relate to systems and methods for enabling effective power and electrical modulation amplitude control of an optical transmitter so as to enhance the performance of an associated optical system and related components.

2. Related Technology

Many high speed voice and data transmission networks rely on optical transceivers and similar devices for facilitating binary transmission and reception of digital data embodied in the form of optical signals. Typically, data transmission in such networks is implemented by way of an optical transmitter, such as a laser, while data reception is generally implemented by way of an optical receiver, an example of which is a photodiode. In general, the optical transmitter and optical receiver communicate with each other by way of a suitable optical transmission medium, such as an optical fiber.

Due to the wide variety of applications wherein optical networks are employed, such optical networks may include, in addition to basic components such as optical transmitters and optical receivers, various other associated systems and devices that serve to implement one or more functionalities that are characteristic of a particular type of application. While such other systems and devices provide useful functionality, those systems and devices often implicate concerns relating to the overall performance of the associated optical system, as discussed below.

One type of optical communication system that implicates certain characteristic or unique problems are those systems sometime referred to as long-haul communication systems. Generally, long-haul communication systems refer to those optical systems, and associated devices, that are used to facilitate voice and/or data transmission over relatively long geographical distances. One example of a long-haul communication system is a fiber optic telephone network. While long-haul, fiber optic communication systems are useful in transmitting high volumes of voice and data over long distances, such long transmission distances implicate certain requirements and associated problems with respect to the structure and operation of the long-haul communication system.

By way of example, the quality of optical signals that are transmitted over relatively long distances tends to degrade over distance. One approach to addressing this problem involved the use of repeaters located at predetermined intervals along the transmission path. In general, the repeater receives an optical signal, converts the optical signal to an electrical signal which is then amplified by the repeater. After amplification, the repeater then converts the amplified electrical signal back into an optical signal and transmits the optical signal to the next repeater or end node. Thus, such repeaters require that operations be performed both in the electrical and optical domains.

While repeaters proved useful in some applications, the necessity of operating in both electrical and optical domains is problematic because repeaters can only operate on a single data stream or optical channel. For example, wavelength multiplexed systems have many data streams on many separate optical channels, where each channel corresponds to a different wavelength. Thus, each data stream would have to be demultiplexed, presented to a multiplicity of repeaters, then again multiplexed back into a single fiber. Not only is this process operationally complex, but signal losses are incurred both during demultiplexing and subsequent multiplexing.

In light of the inherent limitations of repeaters, "pure" optical amplifiers have been developed that operate strictly in the optical domain and thus are well-suited for wavelength multiplexed applications. Generally, long-haul communication systems employ a number of optical amplifiers which are located at predetermined intervals along the transmission path and serve to amplify the transmitted optical signals so that a high quality signal is received at even the most remote node, or receiver, of the optical network.

One example of such an optical amplifier is an erbium-doped fiber amplifier ("EDFA"). Optical amplifiers such as EDFAs have been widely employed as a result of their ability to produce an accurately amplified replication of any complex optical input, possibly containing many data streams at different optical wavelengths, for further transmission along the network. Consequently, optical amplifiers have proven particularly popular in wavelength division multiplexing ("WDM") applications.

In general, optical amplifiers such as EDFAs include a length of doped optical fiber. Typically, the doping element is a rare earth element, such as erbium, having an atomic structure such that the doped fiber is suitable for amplifying light. The EDFA operates in connection with one or more pump lasers that serve, in general, to exploit the light amplification ability of the atomic structure of the doped fiber.

More particularly, such pump lasers typically operate at a wavelength of 980 nanometers ("nm") or 1480 nm and operate to introduce energy into the doped fiber. As the degraded optical signal, typically having a wavelength of 1310 nm or 1550 nm, enters the EDFA, the energy generated by the pump laser serves to excite the erbium or other rare earth element in the doped fiber so that the erbium atoms release their stored energy in the form of additional 1550 nm or 1310 nm light. This process is repeated as the optical signal passes through the doped fiber, so that by the time the optical signal reaches the end of the doped fiber, the optical signal is of sufficient strength to be re-transmitted for an additional distance.

As suggested by the foregoing, optical amplifiers provide useful functionality in a long-haul optical networks. However, the performance of such optical amplifiers and, thus, the performance of the optical network as a whole, is often adversely affected by the systems, methods and devices used to control the operation of the optical transmitter.

For example, optical amplifiers such as EDFAs are particularly sensitive to rapid changes in the optical power at their inputs resulting from the "on" and "off" switching of the transmitters which feed data to the EDFA. As discussed below, such sensitivity can cause problems with the optical receivers of the system.

With respect first to the laser bias to the optical transmitter, typical transmitter control systems are configured so that laser bias to the optical transmitter is abruptly, rather than gradually, applied when it is desired to enable operation of the optical transmitter. In similar fashion, typical transmitter control systems abruptly cut laser bias when it is desired to disable operation of the optical transmitter. These abrupt changes in laser bias cause correspondingly rapid changes in the level of optical power received by the optical amplifier, thereby impairing the operation of the controller of the optical amplifier.

Moreover, because typical optical amplifiers are unable to respond quickly to sudden changes in input optical power, the optical output of the amplifier changes for a period of time as the controller of the optical amplifier attempts to achieve and maintain a constant output power. This fluctuation of the output optical power results in fluctuations in the optical output power of all other signals passing through the amplifier, thereby causing problems in their respective associated receivers, such as the receipt, at the receivers, of incorrect and/or incomplete data. In other cases, the receivers are simply unable to process the received signal for a period of time until the amplifier output restabilizes, or the respective receivers have time to adapt to the new optical signal strength presented to them.

As noted above, another problem concerning typical optical transmitter control systems relates to changes in the electrical modulation amplitude of the optical signal transmitted onto the system by the optical transmitter. In general, binary data transmission by an optical transmitter of an optical system is accomplished by transmitting at a relatively higher optical power to indicate a binary "1," and transmitting at a relatively lower optical power to indicate a binary "0." The ratio of the "1" power level to the "0" power level is sometimes referred to as the "extinction ratio," or simply, ER.

Because optical receivers are primarily responsive or receptive to the extinction ratio between the "1" and "0" optical power levels, and not to the average optical power, so long as the average power is above some minimum value and below some maximum value, it is desirable to maintain the extinction ratio at a relatively high, and constant, level. Accordingly, as the extinction ratio drops to a certain point, the optical receiver becomes increasingly unable to accurately or completely detect the incoming data. On the other hand, when the extinction ratio is maintained at a relatively high value, the optical receiver can readily detect the incoming data over a wider range of average optical power levels.

Typical optical systems, and optical transmitters and control systems in particular, are configured so that the electrical modulation signal amplitude which creates the optical data signal is maintained at a high level while power to the optical transmitter is shut down in response to a transmitter disable signal. This approach to data signal modulation control has proven problematic however. In particular, maintenance of the electrical modulation amplitude during laser shutdown often results in undesirable optical spikes being transmitted to the receivers as the modulation peaks exceed the threshold of the otherwise unbiased laser. Because the laser is unbiased, such optical peaks compromise the desired "quiet" state of the data channel.

Various other problems associated with known optical transmitter control systems, devices and methods concern the occurrence of undesirable optical signal wavelength effects, and the response of the receiver to the optical signal received from the optical transmitter. By way of example, uncontrolled, or ineffective control of, electrical modulation amplitude results in undesirable wavelength chirp, or the shifting of the center wavelength, which may adversely affect other data streams on adjacent optical channels. Further, the aforementioned concern with respect to electrical modulation amplitude also results in asymmetrical eye patterns, discussed in further detail below, and/or random spikes that compromise the ability of the optical receiver to receive and process the transmitted optical signal. This is particularly problematic because the disruption of the EDFA output power caused by the output power change of one optical transmitter will affect all other data streams on all other channels in that EDFA.

In view of the foregoing, and other problems, it has become apparent that solutions are needed to eliminate, or at least attenuate, such problems and shortcomings concerning optical transmitter input bias and optical signal modulation. One possible approach would be to employ an optical transmitter control method where, at startup of the optical transmitter, the electrical modulation amplitude of the optical signal, as well as the laser bias input power to the optical transmitter, are increased in tandem, each at a substantially constant rate, up to respective setpoints. Such a method would involve substantially the reverse process upon transmitter disable. Specifically, the modulation amplitude of the optical signal, as well as the laser bias input power to the optical transmitter, are decreased in tandem, each at a substantially constant rate, down to respective minimums.

While this type of approach would seem to represent somewhat of an improvement over previous methods and systems that involve abrupt changes in laser bias and/or electrical modulation amplitude, such an approach nonetheless produces undesirable "eye" patterns as the power and electrical modulation amplitude move upward from a zero point or move downward to a zero point. More particularly, the eye pattern refers to the waveform of a signal and is typically plotted as the amplitude of the signal over a predetermined period of time, where the 0-to-1 transitions are superimposed on the 1-to-0 transitions to show the relative difference between the two states and to show the rates of change between the two states.

In general, the openness of the eye pattern indicates the relative quality of the optical signal, so that a relatively more open eye pattern implicates a relatively higher quality optical signal, while a relatively closed eye pattern indicates a problem with the optical signal such as noise or bandwidth problems. Thus, the partially "closed," asymmetrical, or otherwise impaired, eye patterns produced by typical optical systems as the laser bias and electrical modulation amplitude move upward from a zero point during transmitter enable, or move downward to a zero point during transmitter disable, reflect undesirable transmitter performance.

In view of the foregoing, it would be useful to provide systems and devices for implementing a method for controlling laser bias to an optical transmitter, as well as for controlling the electrical modulation amplitude of an optical transmitter. Among other things, the method should enable variable rates of change to both the laser bias and to the electrical modulation amplitude of the transmitter, and should also enable the electrical modulation amplitude and laser bias to be adjusted in a predetermined time relationship with respect to each other. Finally, the method should enable changes in electrical modulation amplitude and laser bias to be triggered by the occurrence of predefined events such as optical transmitter enable and disable events.

BRIEF SUMMARY OF AN EXEMPLARY EMBODIMENT OF THE INVENTION

In general, embodiments of the invention are concerned with systems, devices and methods for enabling effective control of the optical output power and extinction ratio of an optical transmitter, by manipulation of the electrical signals applied to the optical transmitter, so as to enhance the performance of an associated optical system and related components.

In one exemplary implementation of the invention, an optical transmitter control system is provided for use in connection with an optical system that includes one or more optical transmitters and that may include other components, such as an optical amplifier. Generally, the optical transmitter control system implements a method for controlling the laser bias to the optical transmitter, as well as the electrical modulation amplitude to the optical transmitter, so as to produce desirable behavior of the optical signal transmitted by the optical transmitter. The optical transmitter control system includes a controller in communication with a laser driver that is configured and arranged to implement various actions, responsive to commands from the controller, concerning the operation of an associated optical transmitter, such as a laser, with which the laser driver interfaces.

Exemplarily, the controller comprises a digital IC controller that includes an I$^2$C bus configured to receive laser bias control and optical signal modulation programming input. In addition, the controller incorporates a memory and central processing unit ("CPU") in communication with each other. The memory stores lookup tables that include information concerning optical transmitter operational parameters, such as optical transmitter laser bias ramps and electrical modulation amplitude ramps. Additionally, the memory includes information concerning predefined events that are used to trigger changes to optical transmitter power input and/or electrical modulation amplitude of the output data signal.

In operation, laser bias control and electrical signal modulation amplitude programming instructions are received at the controller from a user by way of the I2C bus. The laser bias control and electrical modulation amplitude programming instructions are then processed by the controller and passed to the laser driver as analog voltages.

In particular, the TXMOD signal is transmitted to the TX amplifier of the laser driver and sets the desired amplitude of the TXOUT+/− signal output from the TX amplifier and, thus, to the output optical data signal of the optical transmitter. Exemplarily, the electrical modulation amplitude is ramped up or down at a desired rate in response to assertion or de-assertion of a transmitter disable, or TXDisable, signal from the controller until a target extinction ratio is achieved. Additionally, the TXPOWER signal is transmitted to the laser bias/optical power output control circuit, thereby causing a change in the laser bias to the optical transmitter. Similar to the case of the modulation amplitude, the laser bias to the optical transmitter is ramped up or down at a desired rate in response to assertion or de-assertion of TXDisable by the controller.

As a result, the optical amplifier downstream of the optical transmitter sees a gradual rise, or gradual fall, of optical power. This gradual change in optical power substantially precludes abrupt changes or disruptions of the output of the optical amplifier. Additionally, the gradual change in electrical modulation amplitude substantially precludes optical spikes or other undesirable phenomena that may compromise the performance of the optical receivers in the system. These and other, aspects of embodiments of the present invention will become more fully apparent from the following description and appended claims.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF SELECTED EMBODIMENTS OF THE INVENTION

Reference will now be made to the drawings to describe various aspects of exemplary embodiments of the invention. It is to be understood that the drawings are diagrammatic and schematic representations of such exemplary embodiments, and are not limiting of the present invention, nor are they necessarily drawn to scale.

A. Exemplary Operating Environments

It should be noted that while some embodiments of the invention are well-suited for use in conjunction with a high speed data transmission system conforming to the Gigabit Ethernet ("GigE") physical specification, such an operating environment is exemplary only and embodiments of the invention may, more generally, be employed in any of a variety of high speed data transmission systems, some of which may have line rates up to, or exceeding, 10 gigabits per second ("Gbps").

Figure 1:
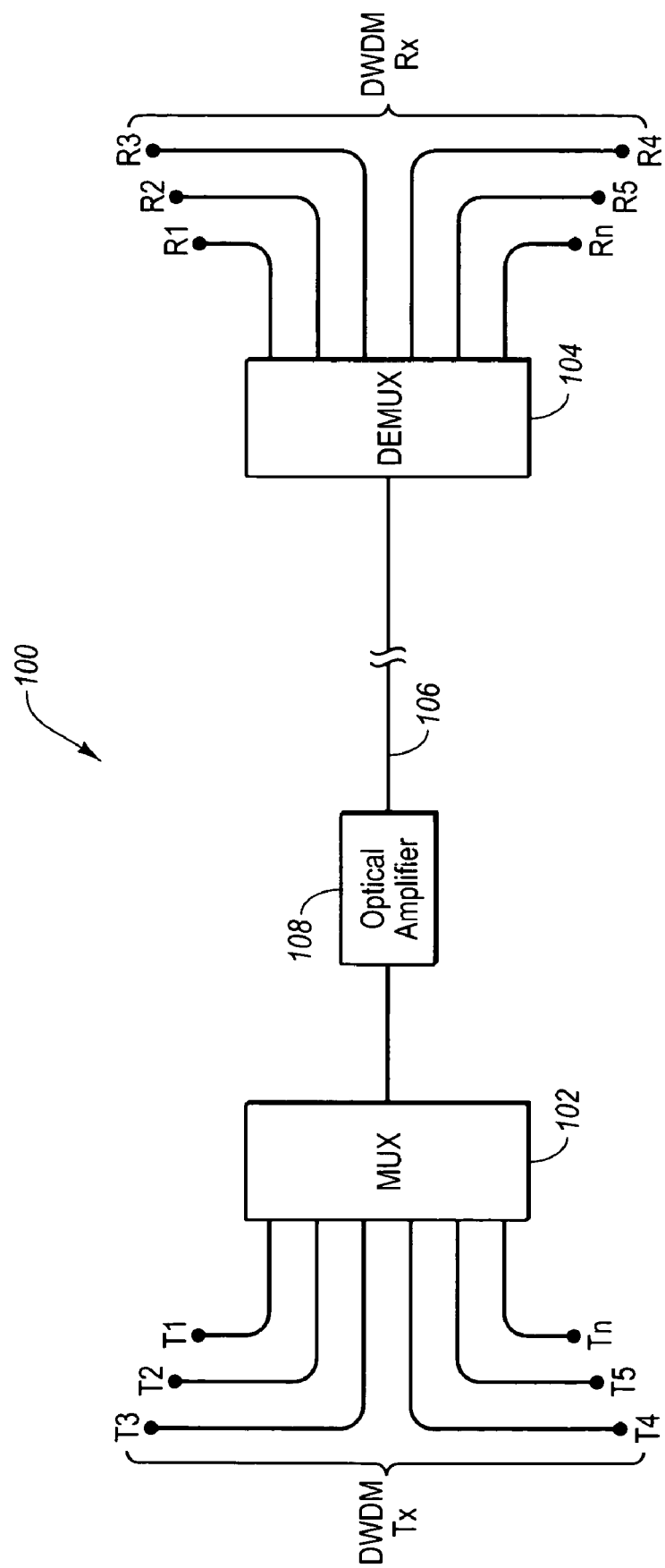
FIG. 1 is a schematic diagram that illustrates various aspects of an exemplary operating environment for embodiments of the present invention.

With specific reference now to FIG. 1, an exemplary implementation of a long-haul, high speed data transmission system is indicated generally at 100. Exemplarily, the data transmission system 100 is configured for use in dense wavelength division multiplexing ("DWDM") applications. In this exemplary implementation, a plurality of transmit and receive channels are accordingly provided.

In the illustrated embodiment, the data transmission system 100 includes a multiplexer 102 configured to receive a plurality of input optical data signals on different optical wavelengths, each of which is transmitted by a corresponding optical transmitter, denoted as T1 through Tn, and each of which corresponds to a "receive" channel of the multiplexer 102. As suggested by the foregoing, the multiplexer 102 enables dense wavelength division multiplexing ("DWDM") of a plurality of input optical data signals, collectively denoted as Tx.

The data transmission system 100 further includes a demultiplexer 104 that communicates with, among other things, the multiplexer 102 by way of an optical fiber 106. In particular, the demultiplexer 104 is generally configured and arranged to receive a multiplexed optical signal from the multiplexer 102 over the optical fiber 106 and then to extract the various discrete optical signals that collectively comprise the multiplexed signal received at the demultiplexer 104. As indicated in FIG. 1, the demultiplexed signals, collectively denoted at Rx, each correspond to a particular output channel of the demultiplexer 104. After demultiplexing has occurred, each of the component signals is then transmitted to a corresponding receiver, denoted at R1 through Rn.

With continuing attention to FIG. 1, the data transmission system 100 further includes one or more optical amplifiers 108 interposed in the transmission path between the multiplexer 102 and the demultiplexer 104 and configured to pass a multiplexed optical data signal from the multiplexer 102 to the demultiplexer 104. Exemplarily, the optical amplifier 108 comprises an erbium doped fiber amplifier ("EDFA"). However, embodiments of the invention are not constrained for use in connection with EDFAs but, more generally, may be employed in connection with a variety of other types of optical amplifiers as well. Such other types of optical amplifiers include, but are not limited to, optical fibers doped with materials in addition to, or other than, erbium, and referred to generally herein as doped fiber amplifiers ("DFA").

In general, one or more optical amplifiers 108 are employed in applications where the multiplexed optical data signal requires amplification in order to maintain its strength until arrival at a final destination, such as receivers R1 through Rn. In general, this is accomplished by amplifying the input multiplexed optical signal in the optical domain and then transmitting the amplified optical signal along the optical fiber 106 to the next optical amplifier, to the demultiplexer 104, or other component, as applicable.

B. General Aspects of an Exemplary Transmitter Control System

Figure 2:
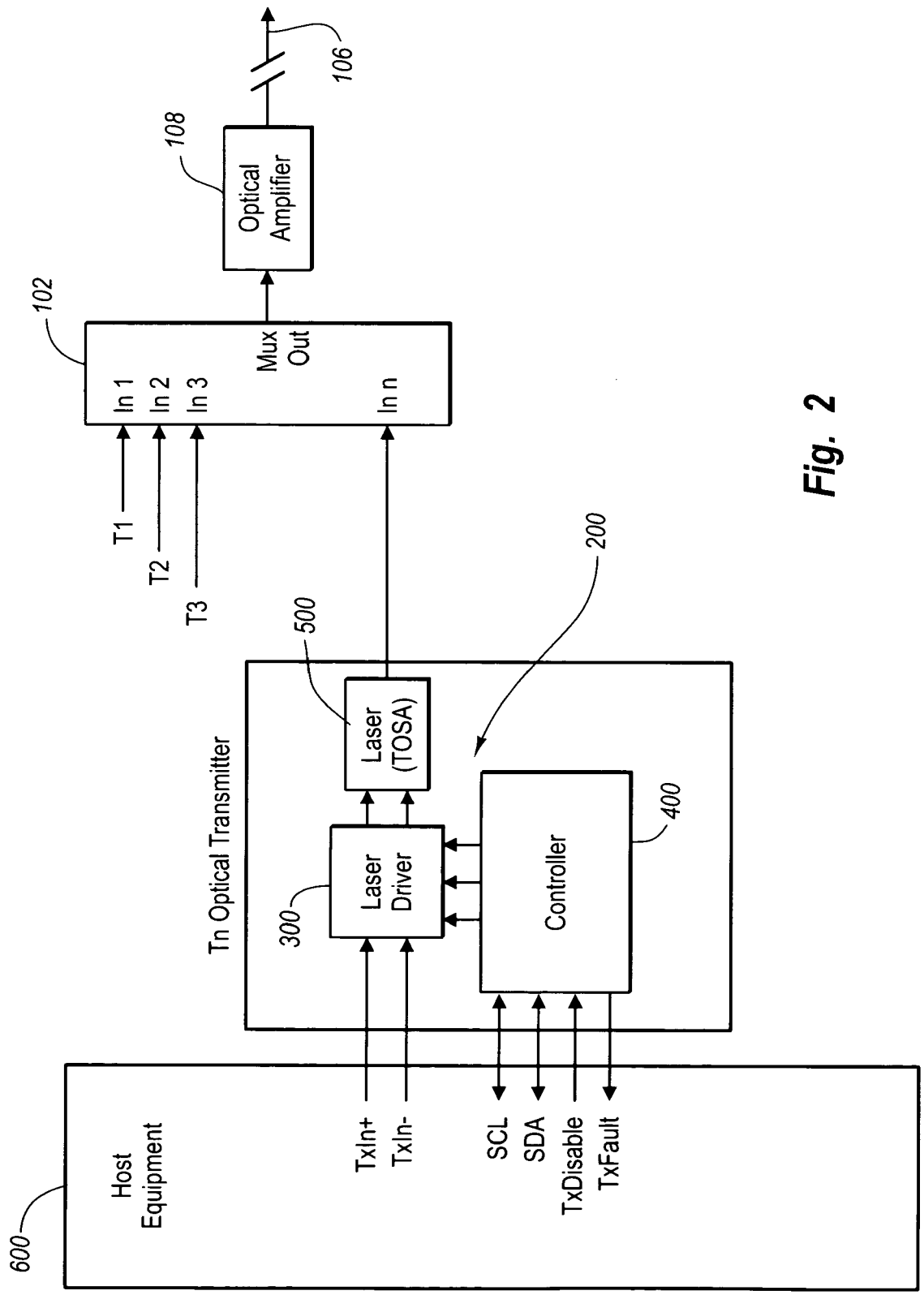
FIG. 2 is a schematic diagram that illustrates aspects of an exemplary embodiment of a transmitter control system as employed in a typical operating environment.

Directing attention now to FIG. 2, details are provided concerning an exemplary transmitter control system, generally denoted at 200, suitable for use in connection with one or more optical transmitters, such as optical transmitters T1 through Tn. As generally indicated in FIG. 2, the exemplary implementation of the transmitter control system 200 includes a laser driver 300 in communication with a controller 400. In the illustrated embodiment, the transmitter control system 200 is implemented together with the transmit optical subassembly ("TOSA") 500 so as to collectively define an optical transmitter, such as the optical transmitter Tn. Both the laser driver 300 and controller 400 are configured as well for communication with host equipment 600.

Generally, the transmitter control system 200 provides input to the TOSA 500 concerning the optical signal transmitted by optical transmitter Tn into the input channel "n" of the multiplexer 102. The optical signal thus transmitted corresponds to an input data signal that is received at the laser driver 300 and then passed to the TOSA 500 in accordance with various control signals received from the controller 400.

Thus, the laser driver 300 of the transmitter control system 200 uses the information contained or reflected in those control signals to control the performance and operation of the TOSA 500 with respect to the optical data signal transmitted by the TOSA. The optical data signal generated by the TOSA is then transmitted onto the optical network. In this way, the laser driver 300, guided by the controller 400, and/or by input from other systems and devices, is able to cause the performance of certain operations with respect to the optical data signal ultimately transmitted by the TOSA 500.

As discussed in further detail below, aspects of the performance and operation of the TOSA 500, and associated components, that may be controlled by way of the transmitter control system 200 include, among other things, the laser bias level to a laser diode of the TOSA, and the modulation of the optical data signal transmitted by the laser diode of the TOSA. Additionally, at least some implementations of the transmitter control system 200 are configured to receive information, or feedback, concerning the signal transmitted by the optical transmitter Tn to the multiplexer 102 and to use that information in performing additional operations concerning the optical transmitter Tn.

With continuing reference to FIG. 2, the input data signal to the laser driver 300 takes the form of digital data signal that is designated TXIN+/− and denotes a data signal received by the laser driver 300 from a customer. Generally, the +/− designation refers to the fact that, in at least some implementations, the signal channel consists of two data transmission lines of opposite polarities. Thus, in this exemplary implementation, the signal designated TXIN+/− actually comprises a first line TXIN+ and a second line TXIN−. In the illustrated implementation, the input data signal TXIN+/− is received at the laser driver 300 by way of customer host equipment 600, which may comprise a computer and/or other systems and devices employed in connection with data communications.

The controller 400 is configured to interact with the host equipment 600 as well. For example, the controller 400 is configured to transmit an internally generated fault signal, designated TxFAULT, to the host equipment 600, as well as to receive the TxDISABLE signal by way of the host equipment 600, as disclosed in further detail herein. Finally, the SCL and SDA signals are used by the host equipment 600 to read diagnostic data from the transceiver, and by the manufacturer of the optical transmitter to load setup and configuration data into the memory of the optical transmitter.

C. Aspects of an Exemplary Laser Driver and Associated Functions

With the foregoing general aspects of the relation between the laser driver 300 and controller 400 in view, attention is directed now to various specific components, and their associated functionalities, of an exemplary implementation of the laser driver 300. In general, the illustrated embodiment of the laser driver 300 takes the form of a digital integrated circuit ("IC") that includes various components generally configured and arranged to enable control of the laser bias to the TOSA 500, as well as control of the modulation of the optical data signal transmitted by a laser diode 502 of the TOSA 500.

With regard to the aforementioned functionalities, the laser driver 300 is, more particularly, configured and arranged to receive one or more control signals from the controller 400 directing the laser driver 300 and, specifically, a modulator 302 of the laser driver 300, to perform various operations respecting the operation of the TOSA 500 and, specifically, the operation of the laser diode 502. Note that the modulator 302 may also be referred to herein as a "TX amplifier."

Figure 3:
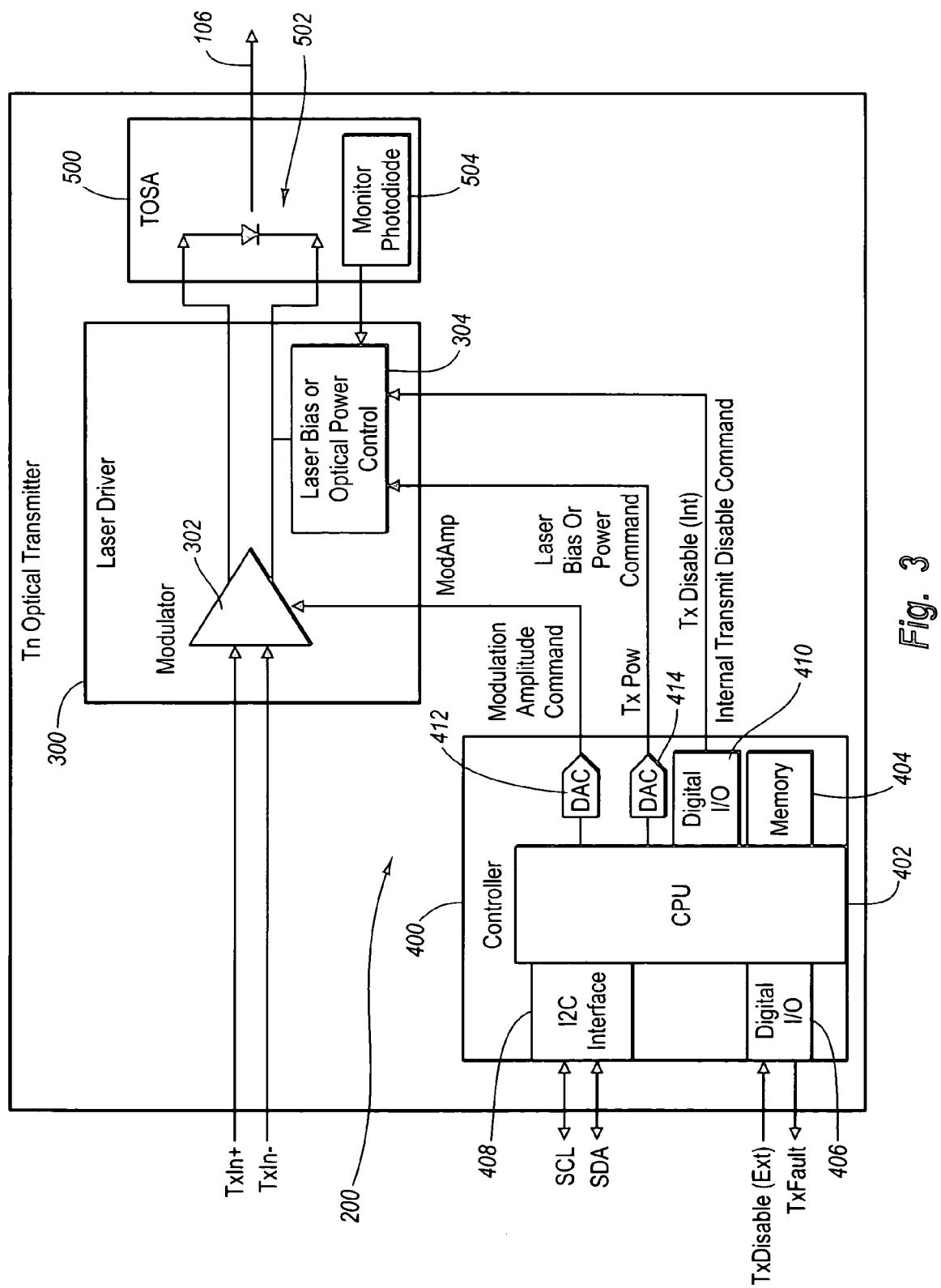
FIG. 3 is a schematic diagram that illustrates aspects of an exemplary embodiment of an exemplary optical transmitter that includes TOSA in communication with a transmitter control system having a controller and laser driver.

Exemplarily, the operations performed by the modulator 302 of the laser driver 300 with respect to the TOSA 500 generally concern, as noted earlier, the modulation of the optical data signal transmitted by the laser diode 502. More particularly, the output amplitude of the modulator 302 determines the optical modulation, or ER, of the optical signal transmitted by the laser diode 502. As indicated in FIG. 3, control of the modulator 302 in this regard is afforded through the use of a modulation amplitude command, sometimes referred to herein as the "MODAMP" signal, issued by the controller 400 to the modulator 302. In at least some implementations, the MODAMP command takes the form of an analog signal. Of course, the modulator 302 may implement other functionalities as well with respect to the laser diode 502 and/or other components. Further details concerning the assertion and use of the modulation amplitude command are provided below in connection with the discussion of FIGS. 4 and 5.

In addition to implementing certain functionality concerning the electrical modulation amplitude of the optical data signal transmitted by the laser diode 502, exemplary embodiments of the transmitter control system 200 also afford control of the laser bias to the laser diode 502 of the TOSA 500. In general, this functionality is implemented by way of a laser bias control circuit 304 of the laser driver 300 that is responsive to commands received from the controller 400, as well as to feedback received from the monitor photodiode 504 of the TOSA 500 concerning the optical output power of the laser diode 502.

It should be noted that the laser bias control circuit 304 and the modulator 302 of the laser driver 300 are implemented together in a single IC in some cases, but may be implemented separately as well. Moreover, while referred to as a "laser bias" control circuit, the laser bias control circuit 304 is also configured to implement, among other things, changes to the optical output power of the laser diode 502, as discussed below.

As indicated in FIG. 3, the laser bias control circuit 304 is configured to receive laser bias commands and optical power commands from the controller 400. Thus, control of the laser diode 502 can be implemented with respect to at least two different operating perspectives. More particularly, the laser diode 502 may be operated in connection with both closed loop and open loop feedback arrangements.

In an open loop type of arrangement, a laser bias command from the controller 400 specifies a particular input bias to the laser diode 502, so that a defined bias is implemented, though the optical power output of the laser diode 502 may nonetheless vary due to factors such as the age and temperature of the laser diode 502. Such an arrangement is sometimes referred to as "open loop control" because the feedback is taken from the input to the laser diode 502, rather than from the output of the laser diode 502. The laser bias command, as well as the optical power command discussed below, is indicated generally at "TxPOW" in FIG. 3 and comprises an analog signal in at least some embodiments of the invention.

In other cases, an optical power command from the controller 400 to the laser bias control circuit 304 specifies a particular output power level of the laser diode 502, so that a defined optical power output is implemented, though the laser bias may vary. More particularly, the monitor photodiode 504 reads the optical output of the laser, or laser diode 502 in the illustrated embodiment. The laser bias control circuit 304 uses this optical feedback to adjust the bias applied to the laser to whatever value necessary to cause achievement of the commanded optical output. In this case, the bias tends to vary over temperature and age and from one laser to the next, but the optical power output of the laser diode 502 remains constant. Such an arrangement is sometimes referred to as "closed loop control" because the feedback is taken from the actual "controlled" parameter, which is the optical output power of the laser diode 502, not the laser bias, and the bias is driven to null out the error between the optical power command and the actual optical output power.

Finally, the laser bias control circuit 304 also enables the TOSA 500 to be shut down, or disabled, upon the occurrence of certain conditions. By way of example, and as indicated in FIG. 3, the controller 400 is configured to assert an internal TxDISABLE(INT) signal and to transmit that signal to the laser bias control circuit 304. Generally, assertion of the internal TxDISABLE(INT) signal reflects the inability of the optical transmitter to correctly transmit, taking into consideration, for example, the results of eye safety self-tests, and internal wavelength validity tests.

In other cases, shutdown of the TOSA 500 may be implemented by assertion of the external TxDISABLE(EXT). External shutdown may be performed, for example, when it is desired to turn the optical channel off by command from the host equipment. As indicated in FIG. 3, and discussed in further detail below, the TxDISABLE(EXT) signal is instigated by a user and received at the controller 400 from an external source, such as host equipment 600 (see FIG. 2). Alternatively, the TxDISABLE(EXT) signal may be transmitted directly from the host equipment 600 to the laser driver 300, bypassing the controller 400. In one alternative arrangement, the disable command signal from the user is proxied through the controller 400 and expressed in the analog TxPOW and/or MODAMP signals, rather than as a separate logic signal such as TxDISABLE(EXT).

In the case of both TxDISABLE(EXT) and TxDISABLE (INT), deassertion of those signals indicates resumption of the operation of the laser diode 502. Note that both TxDISABLE(EXT) and TxDISABLE(INT) are digital signals in at least some embodiments of the invention. In order to facilitate discussion herein, reference is made in some cases to a general TxDISABLE signal where it is not necessarily intended to particularly refer to TxDISABLE(EXT) or TxDISABLE (INT).

It should be noted with respect to the enumeration and combinations of the various data, monitoring, power, control, and other, signals disclosed herein that such signals and combinations and uses thereof are exemplary only and are not intended to limit the scope of the invention. Accordingly, other exemplary embodiments of the transmitter control system 200 may include, implement or embody additional or alternative functionalities, as necessary to suit the requirements of a particular system or application. Moreover, feedback loops and circuits may be employed in connection with a variety of different signals, and combinations thereof, in the monitoring and/or controlling of the performance of various systems and devices. Thus, the scope of the invention should not be construed to be limited to the exemplary embodiments disclosed herein.

D. Aspects of an Exemplary Controller

With continuing reference to FIG. 3, attention is directed now to an exemplary embodiment of the controller 400 as may be employed in connection with the laser driver 300. The illustrated embodiment of the controller 400 includes a central processing unit ("CPU") 402 and a memory 404 in communication with each other. In some implementations of the invention, the controller 400 comprises a Texas Instruments processor, model number MSP430F169. However, any other processor, controller or device effective in implementing the functionality disclosed herein may alternatively be employed.

The exemplary controller 400 further includes a digital input/output ("I/O") 406 and an I$^2$C bus 408, both of which are configured to communicate with the CPU 402 and, among other things, to receive user-specified instructions and input concerning the operation of the laser driver 300 and TOSA 500. An additional digital I/O 410 enables transmission of transmitter disable commands from the controller 400 to the laser bias control circuit 304, while digital-to-analog ("DAC") converters 412 and 414 are generally employed in the control of the operations of the modulator 302 and laser bias control circuit 304, respectively.

In the illustrated embodiment, the DACs 412 and 414 are integrated inside the controller 400 IC and operate to deliver analog voltages to the controlled circuits. The DACs are, in some cases, separate ICs commanded by the controller 400. In other cases however, a serial interface is provided between the controller 400 and the laser bias control circuit 304 and/or the modulator 302, and the corresponding DACs are located inside the respective controlled circuits.

In at least some implementations, DACs are not employed. Rather, components such as digital potentiometers, or pulse width modulators ("PWM") are alternatively used by the controller 400 to create analog control signals such as MODAMP and TxPOW. The scope of the invention should not be construed to be limited to components and devices such as DACs, digital potentiometers or PWMs however. Rather, any component(s) or combinations thereof that are effective in implementing control signals, and changes to control signal values, may alternatively be employed.

In any case, exemplary embodiments of the controller 400 are, as discussed earlier herein, configured to enable definition and implementation of various methods and processes concerning data signal electrical modulation amplitude and control of laser bias to optical transmitters such as the laser diode 502 of the TOSA 500. More particularly, the controller 400 can be readily programmed to conform with the requirements of a wide variety of different types of optical systems and devices. Thus, the controller 400 enables considerable flexibility with respect to the control of optical signal modulation and the laser bias to the optical transmitter by way of changes to laser bias and/or electrical modulation amplitude settings.

As disclosed in further detail elsewhere herein, such laser bias and electrical modulation amplitude settings may include, but are not limited to, a target ER, the time period over which a change in laser bias and/or electrical modulation amplitude is to be accomplished, start points and set points for the laser bias and/or modulation change, the specified change in the laser bias and/or modulation as a function of time, and the temporal relationship between the specified laser bias change and the specified signal modulation change. Of course, various other considerations may inform the implementation of the optical transmitter laser bias change and the optical signal modulation amplitude change.

In exemplary implementations, the programming and setup of the controller 400 simply requires entry of a desired signal set point for the electrical modulation amplitude and the laser bias or optical power. More particularly, exemplary implementations of the controller 400 provide for a user-accessible selection bit for signal modulation DAC 412 set, as well as a user-accessible selection bit for power/bias DAC 414 set.

This information is pushed to the DACs in connection with assertion of the control signal by the controller 400. Finally, with respect to the controller 400 programming, it should be noted that each of the transmitters T1 through Tn (see FIG. 1) may be programmed independently in accordance with the requirements of a particular application or system.

With continuing reference to FIG. 3, the controller 400 is configured not only to manipulate control signals so as to enable achievement of particular results concerning the optical signal transmitted by the TOSA 500 but, as noted earlier, the controller 400 also enables control of both startup and shutdown of the optical transmitter Tn. For example, the controller 400 is configured to transmit an assertion of TxDISABLE (INT) to the laser driver 300 by way of digital I/O 410 upon the occurrence of certain internal conditions, such as those disclosed elsewhere herein. Deassertion of TxDISABLE (INT) likewise occurs by way of digital I/O 410.

In yet other cases, the controller 400 indirectly facilitates startup and shutdown of the optical transmitter Tn in connection with assertion or deassertion of TxDISABLE(EXT), received through digital I/O 406, by an external source or user. The digital I/O 406 also enables the controller 400 to transmit a fault indicator, such as TxFAULT, to external equipment by way of digital I/O 406.

With respect to events such as the assertion and deassertion of a TxDISABLE signal, that may be used as a basis for triggering changes in signal modulation and/or laser bias, embodiments of the controller 400 enable ready compliance with various standards such as those promulgated in connection with the Multi-Source Agreement ("MSA"), IEEE SFF-8472, and IEEE SFF-8053, for example. As to assertion of TxDISABLE for example, the controller 400 permits strict MSA compliance, specifically, less than 10 microseconds ($\mu$s). Similarly, the controller 400 enables the user to implement a relatively fast response to TxDISABLE deassert. Exemplary embodiments of the invention enable a user to choose, such as by setting or clearing a selection bit in memory via the I$^2$C interface 408, whether the "fast" MSA compliant approach is implemented, or whether a ramp control function, discussed below, is employed instead. The selection bit may or may not be non-volatile.

Finally, the illustrated embodiment of the controller 400 is also configured to send and receive the SCL and SDA signals to/from external devices such as host equipment 600 (see FIG. 2). As indicated in FIG. 3, communication of these signals is implemented by way of the I$^2$C interface 408.

E. Exemplary Control Functionalities

Embodiments of the invention are not limited to implementation of signal modulation and laser bias modifications solely in connection with MSA and other standards. Instead, embodiments of the transmitter control system 200 generally enable the user to define a wide variety of customized approaches to the implementation of laser diode 502 electrical modulation amplitude and laser bias modifications. More particularly, the controller 400 generally enables the definition of control signals that permit the achievement of various desired effects, through the operation of the laser driver 300, with respect to the laser bias supplied to the optical transmitter, and with respect to the modulation of the data signal transmitted by the optical transmitter.

A particular manner, plan or approach to implementation of changes in laser bias and electrical modulation amplitude is sometimes referred to herein as comprising, respectively, a "laser bias control scheme" or "modulation amplitude control scheme" or, more generally, simply a "control scheme." As discussed in further detail below, such control schemes may comprise a single function describing the manner in which changes to laser bias and/or electrical modulation amplitude are to be implemented or may, alternatively, comprise a number of different functions. For example, a scheme to increase laser bias may include both linear and non-linear portions defined by, respectively, a linear function and non-linear function.

Further variations to control schemes are possible as well. For example, while a linear portion of a laser bias or electrical modulation amplitude change may generally be described by the single function $y=mx+b$, such linear portion of the change may nonetheless be implemented in such a way that the slope "m" of a first part of the linear portion is different from the slope "m" of a second part of the linear portion. That is, the linear portion may comprise two or more ramps, each of which has a different slope.

With respect to such ramps, for example, at least some embodiments of the invention enable a user to define and employ various types of ramp form control functions that specify the manner in which signal modulation and laser bias modifications are performed by the laser driver 300 with respect to the laser diode 502, or other optical transmitter. Note that laser driver 300 control functions, of which ramp form control functions, or "ramp functions," comprise but one example, may be referred to generally herein as "control functions" or simply "functions." Exemplarily, the ramp functions, and other control functions disclosed herein, are based on lookup tables of DAC values that are stored in the memory 404 and delivered to the DACs. In exemplary embodiments of the invention, the such ramp form control functions are included as part of the transmitter control system 200 such that a user has the option as to whether or not such functions will be employed in a particular situation.

Generally, the implementation of a ramp function with regard to the control of the laser driver 300 causes the laser driver 300 to gradually change electrical modulation amplitude and, correspondingly, gradually change the optical extinction ratio and/or laser bias. Such gradual changes to the optical extinction ratio and/or laser bias correspond, in turn, to gradual changes in the average optical power transmitted at certain defined rates, so that the problems typically associated with relatively abrupt increases or decreases in optical output power and/or ER are thereby reduced or eliminated. As suggested by the foregoing, the term "ramp" is a convenient way to describe the graphical representation of the rate of change, with respect to time, of signal modulation and/or laser bias. As discussed below however, embodiments of the invention are not limited solely to the definition and implementation of ramp functions.

Some useful aspects relating to the definition and implementation of such ramp functions concern the response of components, such as DFAs and receivers, located downstream of the laser diode 502 or other optical transmitter. For example, a gradual ramp up of laser bias to the optical transmitter, such as would occur in response to TxDISABLE deassert, reduces or eliminates the oscillation in the DFA output signal that typically results when input optical power to the DFA is abruptly changed. Further, a gradual increase in data signal electrical modulation amplitude causes the receiver (see, e.g., FIG. 1) to "see" a clean and symmetric rise of the data signal. Among other things, this gradual increase in data signal ER substantially precludes the data signal reception problems that often occur when the detectors of the receiver have to process asymmetric eyes or random optical spikes. As noted earlier herein, such reception problems may include the receipt, at the receivers, of incorrect and/or incomplete data.

Further useful results are achieved when the ER of the optical data signal generated by the optical transmitter is ramped downward, such as in response to TxDISABLE assert, from a predetermined threshold, for example, to a minimum point, such as zero. In particular, the receiver sees the data signal clearly and cleanly until the data signal drops below an AC detection threshold into a quiet background. Further, a gradual decrease in the optical power output from the transmitter likewise substantially precludes problems at the DFA, such as output signal oscillation, that are typically associated with abrupt changes in the input optical power to the DFA.

As suggested earlier herein, various specific aspects of particular control functions may likewise be defined and implemented by the user in connection with the use of the laser driver 300 to control the operation and performance of an optical transmitter such as the laser diode 502. By way of example, the electrical modulation amplitude of the optical signal and/or the laser bias to the optical transmitter can be programmed to ramp upward, in response to TxDISABLE deassert for example, to a predetermined value from a zero setpoint, or from some other minimum setpoint. In similar fashion, the electrical modulation amplitude of the optical signal and/or laser bias to the optical transmitter may be programmed to ramp downward, in response to TxDISABLE assert for example, from a setpoint to zero, or to some other minimum.

Yet other aspects of the programming of the controller 400 with respect to the signal modulation and/or laser bias control may be defined and/or adjusted as necessary to suit the requirements of a particular application. By way of example, the off-to-on ramps can have a different slope, or rate of change, than the slope or rate of change of the on-to-off ramps. More particularly, the rate at which a change is implemented in the signal electrical modulation amplitude may have one value when TxDISABLE is asserted, and a different value when TxDISABLE is deasserted. The same is likewise true with respect to changes in the power input to the optical transmitter. Moreover, the slope of the modulation ramp, or rate of change of electrical modulation amplitude with respect to time, both at TxDISABLE assert and/or TxDISABLE deassert may be different from, or the same as, the slope of the laser bias ramp at TxDISABLE assert and/or TxDISABLE deassert. Further, it may be useful in some cases to ramp only signal modulation, or only laser bias, while modifying the other parameter according to some nonlinear function.

As yet another example of aspects of the signal modulation and laser bias control that can be defined and implemented in connection with exemplary embodiments of the invention, it may desirable in some instances to provide for transmitter enable and/or disable processes where only a portion of the desired change in signal modulation and/or laser bias proceeds according to a ramp function. The remainder of the change in signal modulation and/or power input could then be defined and implemented in any other suitable way. As an example, it may be desirable in some instances to move laser bias to the optical transmitter quickly from cutoff to just below a defined threshold, then more slowly, such as in accordance with a ramp function, from that threshold to a predetermined set point or maximum. A similar approach can be taken with respect to data signal electrical modulation amplitude changes.

As the foregoing suggests, changes in data signal electrical modulation amplitude and/or optical transmitter laser bias that may be defined and implemented in connection with embodiments of the invention are not limited solely to the linear changes represented by ramp functions. For example, changes in data signal electrical modulation amplitude and/or optical transmitter laser bias may be implemented according to parabolic, geometric, step, or other types of functions. Moreover, yet other control functions may be defined and implemented that comprise hybrid arrangements where a portion of the change in the data signal electrical modulation amplitude and/or optical transmitter laser bias is implemented according to one type of function, while another portion of the change in signal modulation and/or optical transmitter laser bias is implemented according to another type of function. As with other control functions disclosed herein, such hybrid and non-linear control functions may be implemented at TxDISABLE assert and/or at TxDISABLE deassert.

As suggested above, changes to the electrical signal modulation and/or laser bias to the optical transmitter may be programmed to occur in connection with the occurrence of certain predefined events such as, but not limited to, the assertion and deassertion of the TxDISABLE signal. More generally however, such changes in signal modulation and laser bias can be indexed to the occurrence of various other predefined events as well, and the scope of the invention should not be construed to be limited solely to the predefined events disclosed herein.

In addition to enabling the definition and implementation of various control processes concerning signal modulation and laser bias, embodiments of the invention also enable the user to define and implement certain temporal relationships between desired changes in laser bias and desired changes in signal modulation. As an example, in some implementations, the laser bias is ramped prior to any ramping of the signal modulation while, in other implementations, the signal modulation is ramped prior to any ramping of the laser bias.

In another exemplary implementation, the laser bias is ramped, on TxDISABLE deassert, from zero to a predetermined setpoint with zero modulation. After the laser bias is ramped to the setpoint, then the signal modulation is ramped from zero to a predetermined setpoint. In this implementation, the process is substantially reversed on TxDISABLE assert. In particular, on TxDISABLE assert, the signal modulation is first ramped from the setpoint to zero. After the signal modulation is ramped to zero, then the laser bias is ramped from the setpoint to zero. In yet other implementations, the ramping of the modulation of the signal and the ramping of the laser bias, at TxDISABLE assert and/or TxDISABLE deassert, may overlap by some predetermined time period.

As the foregoing makes clear, a wide variety of electrical modulation amplitude and optical transmitter laser bias control operations and sequences may be defined and implemented as necessary to suit the requirements of a particular application. Thus, the transmitter control operations and sequences disclosed herein are exemplary only and are not intended to limited the scope of the invention in any way.

F. Exemplary Operational Aspects of the Transmitter Control System

Figure 4A:
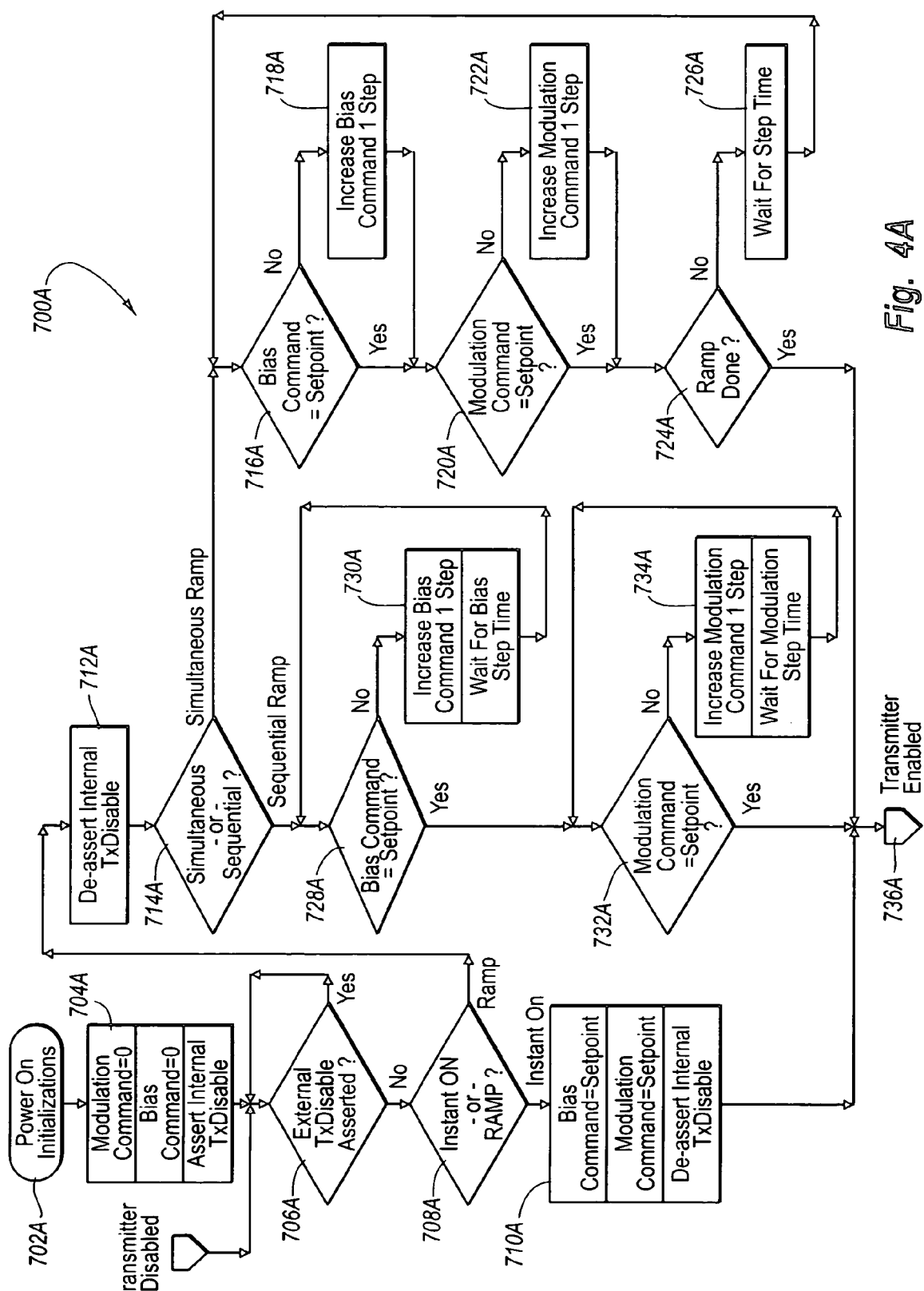
FIG. 4A is a flow diagram indicating aspects of an exemplary process for controlling laser bias and modulation amplitude of an optical transmitter.
Figure 4B:
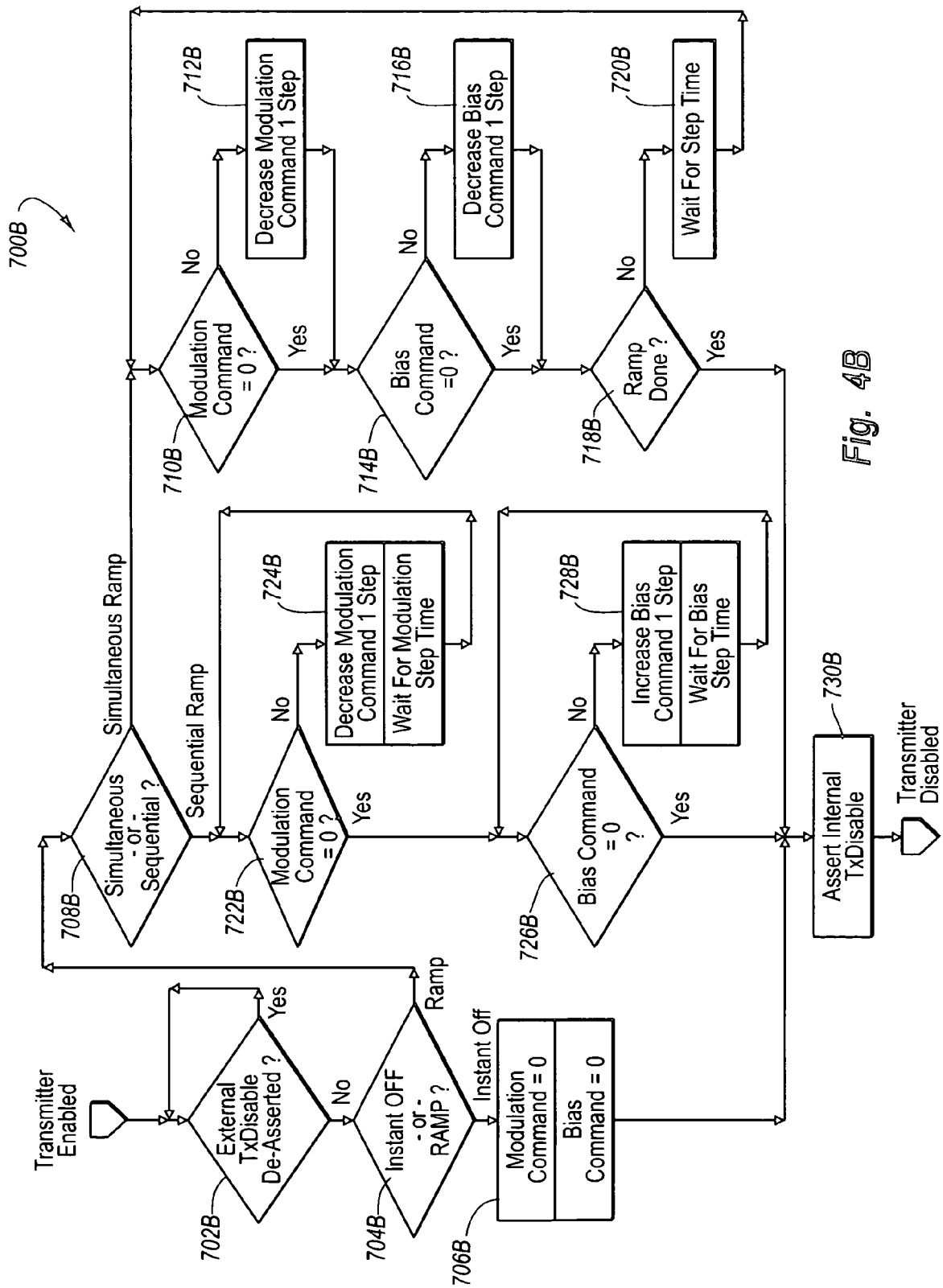
FIG. 4B is a flow diagram indicating further aspects of the exemplary process of FIG. 4A for controlling laser bias and modulation amplitude of an optical transmitter.

Directing attention now to FIGS. 4A and 4B, and with continuing attention to FIG. 3, details are provided concerning exemplary methods implemented in connection with embodiments of the transmitter control system 200. In this regard, FIG. 4A illustrates aspects of a process 700A for implementing control of laser bias and electrical modulation amplitude of an optical transmitter at transmitter "Enable." As noted elsewhere herein, the laser bias and electrical modulation control schemes illustrated in FIG. 4A (as well as FIG. 4B) are exemplary only however, and should not be construed to limit the scope of the invention in any way.

1. Transmitter Enable Processes

Generally, the process 700A represents various exemplary schemes for moving laser bias and electrical modulation amplitude from zero, or some other minimum, to respective desired setpoints in connection with startup of the optical transmitter. As indicated in FIG. 4A, movement of the laser bias and electrical modulation amplitude from their respective minimums to their respective setpoints can be accomplished according to a "fast," or instant "ON" function, or according to a ramp function. If a ramp function is employed, the laser bias and electrical modulation can be ramped up either simultaneously, or sequentially.

With more particular attention now FIG. 4A, the process 700A commences at stage 702A where power "on" initializations are performed. At stage 704A, the initial state of the optical transmitter is set. In the illustrated implementation, this means that the electrical modulation amplitude command is set to zero, a laser bias command is set to zero, and TxDISABLE(INT) is asserted. At the conclusion of stage 704A then, the laser transmitter is powered up, but there is, as yet, no input electrical modulation amplitude command or laser bias command and the optical transmitter is in a disabled state where no optical transmissions occur. Note that the electrical modulation amplitude command may also be referred to herein simply as "modulation command" and, further, the laser bias command may be referred to simply as "bias command."

The process 700A then advances to stage 706A where a check is made to determine whether or not TxDISABLE (EXT) has been asserted. In the event that TxDISABLE (EXT) has been asserted, the optical transmitter, or simply "transmitter," enters an idle "disabled" state until TxDISABLE(EXT) has been deasserted.

Upon deassertion of TxDISABLE(EXT), the process advances to stage 708A where a determination is made as to whether the laser bias and electrical modulation amplitude are to be moved from the zero value, or other minimum, to the desired set point according to a "fast" function such as is dictated by the MSA standard, or whether the laser bias and electrical modulation amplitude are to be ramped from the zero point, or other minimum, to the respected desired setpoints. In the event that the "fast" function is selected, the process advances to stage 710A where the laser bias is moved abruptly upward from the minimum, or zero, to the set point and, at substantially the same time, the signal modulation amplitude is moved abruptly upward from zero, or another minimum, to the desired set point. At substantially the same time, TxDISABLE(INT) is deasserted and the process 700A advances to stage 736A where the transmitter moves into an "enabled" state where optical transmissions can then occur.

If, at stage 708A, it is determined that a ramp function is desired for the laser bias and signal modulation, instead of the "fast" function, the process 700A advances to stage 712A where TxDISABLE(INT) is deasserted. The process then advances to stage 714A where a choice is made as to whether the ramping of the signal modulation amplitude and laser bias are to be implemented simultaneously or are, instead, to be implemented in sequential fashion with respect to each other.

In the event that it is determined that a simultaneous ramp function is desired, the process 700A advances to stage 716A where a determination is made as to whether or not the laser bias command has attained the desired set point. If the laser bias command is not at the desired set point, the process advances to stage 718A where the bias command is increased by one step. Such increases to the bias command can be defined and implemented in a variety of different ways.

For example, an increase in bias command can mean that a particular number should be added to the prior value of the bias command, or, alternatively, that the next bias command value in a lookup table should be applied. In yet other implementations, the increase in bias command by one step refers to a command to compute some function of (x+1). The lookup table employed in connection with any bias command increases may, but need not be, the same lookup table as is employed in connection with bias command decreases, discussed below in connection with FIG. 4B.

In any case, once the bias command has either been incremented by one step, or already determined to be at set point, the process 700A advances to stage 720A where a similar check is performed with respect to the signal modulation amplitude command. In particular, at stage 720A, a determination is made as to whether or not the signal modulation amplitude command is at the set point. If the signal modulation amplitude command is not at set point, the process advances to stage 722A where the modulation command is increased one step. It should be noted here that increases in modulation command are similar to increases in the bias command in that such increases and modulation command can be implemented in a variety of different ways, such as those noted above in connection with increase in the laser bias command.

If an increase in modulation command is required and has been performed, the process then advances to stage 724A where a determination is made as to whether or not the ramp to the respective modulation command and bias command set points has been completed. If the ramp is not completed, the process advances to stage 726A where the system waits until the step time passes. After the step time has passed, the process returns to stage 716A to begin another check on the laser bias command set point and the signal modulation amplitude command set point.

If, on the other hand, it is determined at stage 724A that the ramps have been completed for both laser bias command and signal modulation amplitude command, the process advances to stage 736A and the transmitter moves into the "enabled" state.

As noted earlier, the bias command and signal modulation command may be ramped sequentially instead of simultaneously. With continuing reference to FIG. 4A, if it is determined at stage 714A that a sequential ramping process is desired, the process advances to stage 728A where a determination is made as to whether or not the laser bias command is at set point. If the laser bias command is not at set point, the process 700A advances to stage 730A where the bias command is increased by one step and where the system idles until passage of the bias step time. After passage of the bias step time, the process returns to stage 728A to recheck whether or not bias command has reached set point. If it is determined that the bias command has reached the desired set point, the process advances to stage 732A and performs a similar check of the modulation command.

In particular, at stage 732A, a determination is made as to whether or not the modulation command has reached set point. If the signal modulation amplitude command has not reached set point, the process advances to stage 734A where the modulation command is increased one step, and the system waits for passage of the modulation step time. After the modulation step time has passed, the process 700A returns to stage 732A to again check whether or not modulation command has reached set point. This loop continues until a determination is made that the modulation command has reached set point. At that stage, the process then advances to stage 736A where the transmitter moves into the "enabled" state.

2. Transmitter Disable Processes

With attention now to FIG. 4B, details are provided concerning a process 700B that represents various exemplary schemes for moving laser bias and electrical modulation amplitude from respective setpoints to zero, or some other minimum, to in connection with shutdown, or disabling, of the optical transmitter. As indicated in FIG. 4B, movement of the laser bias and electrical modulation amplitude from their respective setpoints down to their respective minimums can be accomplished according to a "fast," or instant "OFF" function, or according to a ramp function. If a ramp function is employed, the laser bias and electrical modulation can be ramped down either simultaneously, or sequentially.

With more particular attention now FIG. 4B, the process 700B commences at stage 702B where a check is made to determine if TxDISABLE(EXT) has been deasserted. If TxDISABLE(EXT) has been deasserted, the system remains in an "enabled" state until TxDISABLE(EXT) is asserted.

Upon assertion of TxDISABLE(EXT), the process advances to stage 704B where a determination is made as to whether the laser bias and electrical modulation amplitude are to be moved from their respective setpoints to a zero value, or other minimum in accordance with a "fast" instant "OFF" function, such as specified by MSA or, alternatively, whether the laser bias and electrical modulation amplitude are to be ramped down from their respective setpoints to a zero value or other minimum.

In the event that the "fast" function is selected, the process advances to stage 706B where the laser bias is moved abruptly downward from setpoint to zero or some other minimum and, at substantially the same time, the signal modulation amplitude is moved abruptly downward from setpoint to zero or some other minimum. The process 700B then advances to stage 730B where TxDISABLE(INT) is asserted and the transmitter moves into a "disabled" state.

If, at stage 704B, it is determined that a ramp function is desired for the laser bias and signal modulation, instead of the "fast" function, the process 700B then advances to stage 708B where a choice is made as to whether the ramping down of the signal modulation amplitude and laser bias are to be implemented simultaneously or are, instead, to be implemented in sequential fashion with respect to each other.

In the event that it is determined that a simultaneous ramp function is desired, the process 700B advances to stage 710B where a determination is made as to whether or not the modulation command has reached zero or some other desired minimum. If the modulation command is not at the desired minimum, the process advances to stage 712B where the modulation command is decreased by one step. Generally, such decreases to the modulation command, as well as the bias command discussed below, can be defined and implemented in a fashion analogous to the modulation and bias command increases discussed above in connection with FIG. 4A.

In any case, once the modulation command has either been decremented by one step, or already determined to be at minimum, the process 700B advances to stage 714B where a similar check is performed with respect to the bias command. In particular, at stage 714B, a determination is made as to whether or not the bias command is at the desired minimum. If the bias command is not at the desired minimum, the process advances to stage 716B where the bias command is decreased one step.

In any case, once the bias command has either been decremented by one step, or already determined to be at minimum, the process 700B advances to stage 718B where a determination is made as to whether or not the ramp down to the respective modulation command and bias command minimums has been completed. If the ramp is not completed, the process advances to stage 720B where the system waits until the step time passes. After the step time has passed, the process returns to stage 710B to begin another check on the signal modulation amplitude command and the laser bias command set point.

If, on the other hand, it is determined at stage 718B that the ramps have been completed for both laser bias command and signal modulation amplitude command, the process advances to stage 730B where TxDISABLE(INT) is asserted and the transmitter moves into a "disabled" state.

As noted earlier, the bias command and signal modulation command may be ramped down sequentially instead of simultaneously. In the illustrated implementation, the modulation command is first ramped to minimum, and then the signal modulation command is ramped to minimum. Of course, this order may be reversed. Further, the ramp sequences may be implemented in an overlapping fashion so that at least a portion of the bias command ramp is implemented at the same time as at least a portion of the signal modulation command ramp.

With continuing reference to FIG. 4B, if it is determined at stage 708B that a sequential ramping process is desired instead of a simultaneous ramp, the process advances to stage 722B where a determination is made as to whether or not modulation command is at minimum. If the modulation command is not at minimum, the process 700B advances to stage 724B where the modulation command is decreased by one step and where the system idles until passage of the modulation step time. After passage of the modulation step time, the process returns to stage 722B to recheck whether or not modulation command has reached minimum. If it is determined that the modulation command has reached minimum, the process 700B advances to stage 726B and performs a similar check and decrease of the bias command.

In particular, at stage 726B, a determination is made as to whether or not the bias command has reached minimum. If the bias command has not reached minimum, the process 700B advances to stage 728B where the bias command is decreased one step, and the system waits for passage of the bias step time. After the bias step time has passed, the process 700B returns to stage 726B to again check whether or not bias command has reached minimum. This loop continues until a determination is made that the bias command has reached minimum. At that stage, the process 700B then advances to stage 730B where TxDISABLE(INT) is asserted and the transmitter moves into a "disabled" state.

G. Exemplary Laser Bias and Signal Modulation Control Processes

As indicated herein, changes to the laser bias and electrical modulation amplitude can be implemented in a variety of different ways depending upon considerations such as system requirements and the nature of the operating environment. Directing attention now to FIGS. 5A through 5C, various exemplary laser bias and electrical modulation amplitude control schemes and processes are illustrated in graphical form.

Figure 5A:
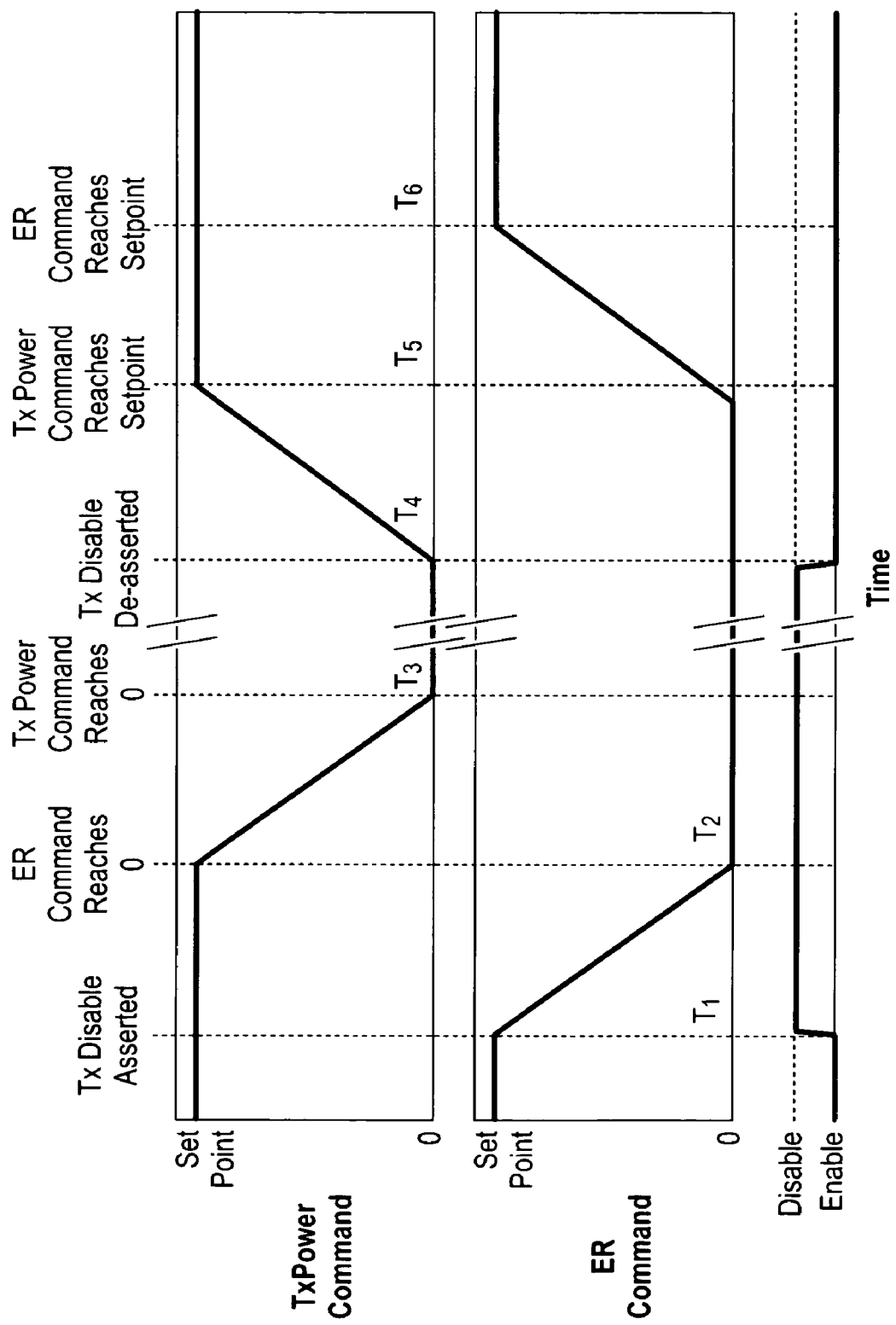
FIG. 5A is a graph of an exemplary scheme for implementing changes, with respect to time, in electrical modulation amplitude and laser bias of an optical transmitter.

With particular attention first to FIG. 5A, the behavior of laser bias and signal modulation amplitude commands upon assertion of TxDISABLE, as well as deassertion of TxDISABLE is presented in graphical form. Note that, with respect to the FIG. 5A, as well as with respect to FIGS. 5B and 5C, signal modulation amplitude command may be referred to as "ER command," and laser bias command may be referred to as "Tx power command." It should further be noted, with respect to FIGS. 5A through 5C, that TxDISABLE may be internally or externally asserted and deasserted.

In general, FIG. 5A is concerned with a situation where changes in the ER command value as well as the Tx power command value are implemented according to a ramp function. As further indicated in FIG. 5A, the changes to ER command and Tx power command occur sequentially with respect to each other. As noted elsewhere herein however, the scope of the invention is not limited to ramp functions such as those illustrated in FIG. 5A. For example, a variety of other functions may alternatively be employed, wherein such alternative functions include, but are not limited to, ER command and/or Tx power command changes that involve two or more different rates of change, ER command and/or Tx power command changes that correspond to a sign wave or exponential curve, or various combinations of the foregoing. Moreover, the ER command and Tx power command ramps may have different slopes.

In the specific case illustrated in FIG. 5A, the changes in the ER command and Tx power command are indicated with respect to time. In the illustrated implementation, the transmitter is in an "enabled" state at $T_0$ and, at time $T_1$, TxDISABLE is asserted. Also at time $T_1$, the ER command level is ramped downwards from the set point to zero, or to some other minimum. The ramp down of ER command continues until time $T_2$.

In this exemplary case, no change occurs to the Tx power command between time $T_1$ and $T_2$. However, beginning at time $T_2$, the Tx power command is ramped down from the set point to zero or some other minimum. The ramp down of Tx power command continues until time $T_3$. Thus, the ramp down of Tx power command begins at approximately the same time, $T_2$, that the ramp down of ER command finishes.

No change occurs to the ER command level between times $T_2$ and $T_3$ so that ER command remains at zero, or the minimum. Between times $T_3$ and $T_4$, both the TX power command and ER command are at zero and the optical transmitter is in a disabled state. At time $T_4$, TxDISABLE is deasserted and ramp up of the Tx power command from zero or some other minimum to the desired set point begins. The ramp up of Tx power command continues until time $T_5$. However, no change occurs to the ER command between time $T_4$ and $T_5$ and, accordingly, ER command remains at zero or other minimum.

Beginning at time $T_5$, the ER command ramps upward from zero or some other minimum to the desired set point. The upward ramp of the ER command continues until time $T_6$. Between times $T_5$ and time $T_6$, the TX power command remains at set point. Finally, from time $T_6$ until the next assertion of TxDISABLE, both the ER command and TX power command remain at their respective set points.

Thus, FIG. 5A graphically depicts a situation where, at assertion of TxDISABLE, the ER command and Tx power command are sequentially ramped down to their respective minimums. In particular, the ER command is first ramped from set point to minimum, while the Tx power command remains at setpoint. After the ER command has ramped down, then the Tx power command is ramped down. Substantially the reverse occurs at deassertion of TxDISABLE. In particular, at deassertion of TxDISABLE, Tx power command is ramped from zero or the minimum up to setpoint. After the Tx power command ramp is completed, then the ER command is ramped upward from zero or the minimum to setpoint. As suggested earlier however, various other control schemes may be employed.

Figure 5B:
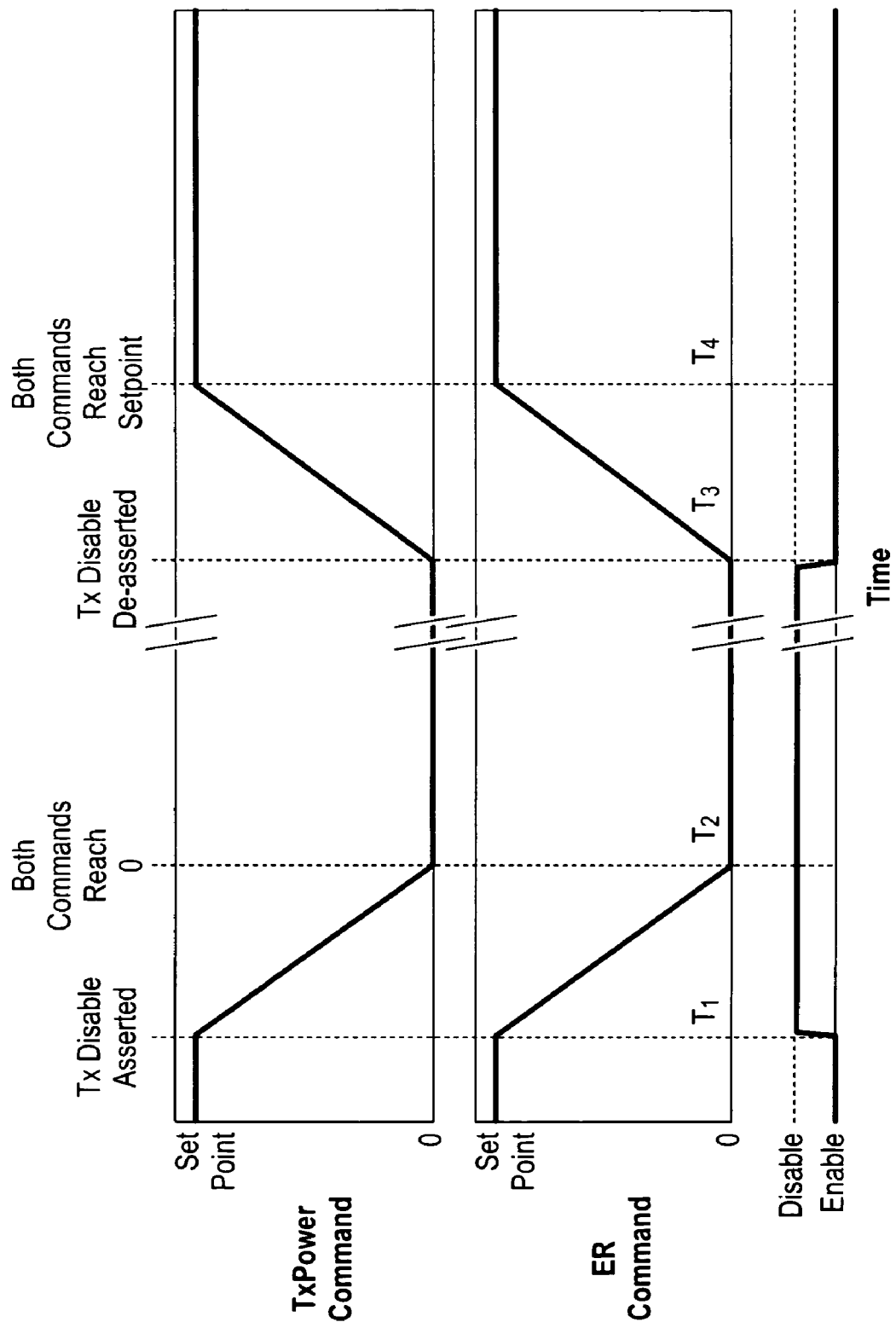
FIG. 5B is a graph of an alternative scheme for implementing changes, with respect to time, in electrical modulation amplitude and laser bias of an optical transmitter.

Directing attention now to FIG. 5B, another ER command and Tx power command control scheme is illustrated. As in the case of FIG. 5A, the behavior of ER command and Tx power command is illustrated with respect to time. At time $T_0$, both ER command and TX power command are at their respective set points. At time $T_1$, TxDISABLE is asserted and Tx power command and ER command both ramp downward to zero or another minimum. The downward ramping of the Tx power a command and ER command continues until time $T_2$.

In the exemplary case illustrated in FIG. 5B, the rate of change in Tx power command and ER command, expressed as the slope of the ramps, is the same in both cases and, moreover, the changes to Tx power command and ER command both occur within the same time frame. From time $T_2$ to time $T_3$, both ER command and Tx power command are at zero, or some other minimum.

At time $T_3$, TxDISABLE is deasserted and ER command and Tx power command are both ramped upwards, at the same rate, to their respective set points. The upward ramp of ER command and Tx power command continues until time T4. When Tx power command and ER command have reached their respective set points at time $T_4$, the ER command and Tx power command are maintained at set point until another assertion of TxDISABLE disable.

Figure 5C:
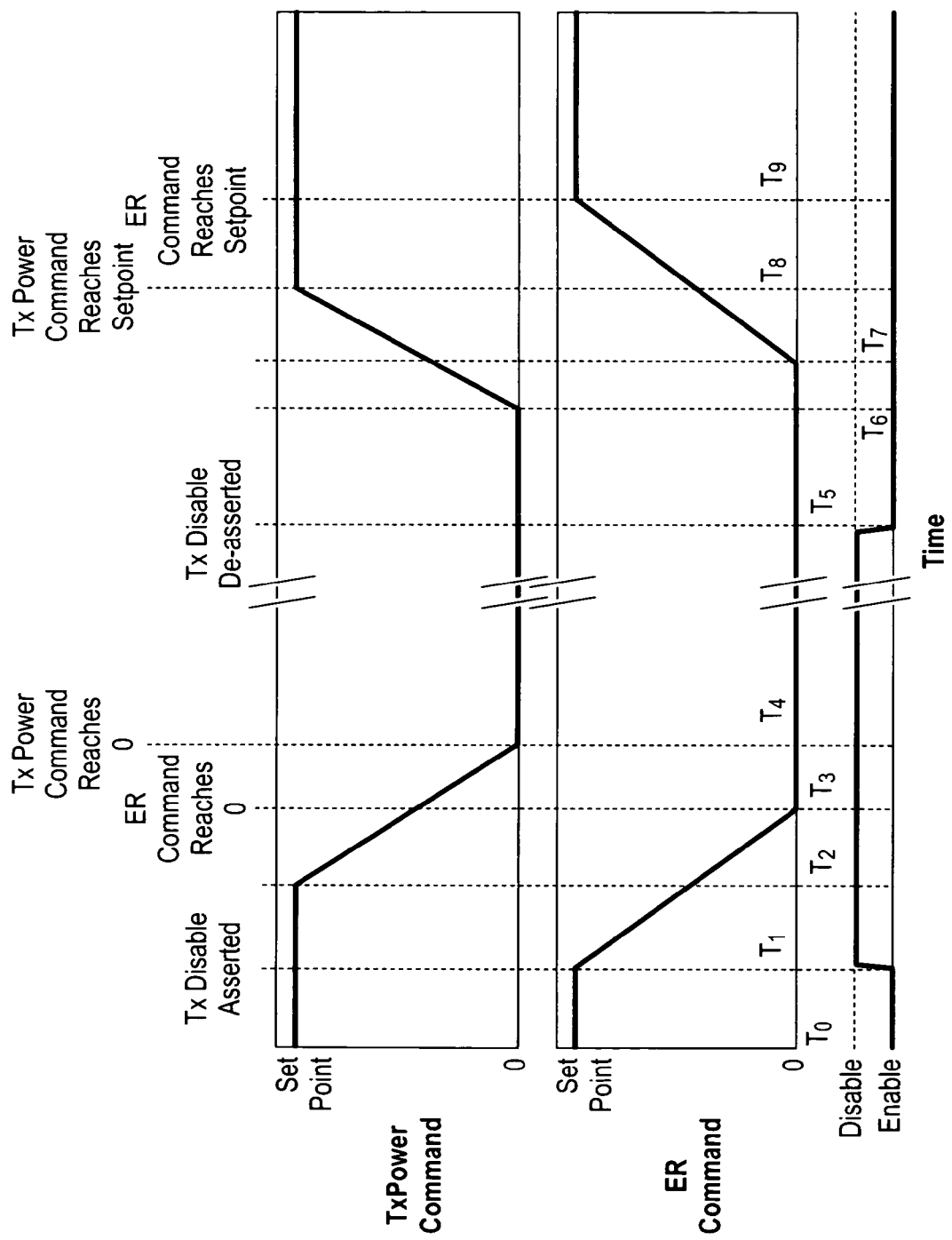
FIG. 5C is a graph of yet another scheme for implementing changes, with respect to time, in electrical modulation amplitude and laser bias of an optical transmitter.

As discussed above, FIG. 5A is concerned with the situation where ER command and TX power command changes between set point and a minimum are accomplished sequentially, both at TxDISABLE assertion and TxDISABLE deassertion. Further, FIG. 5B is concerned with the situation where ER command and TX power command are ramped simultaneously between set point and a minimum value at TxDISABLE assertion and TxDISABLE deassertion. Turning now to FIG. 5C, a situation is illustrated where the ER command and Tx power command ramps between set points and minimums overlap with each other.

In particular, at time $T_1$, TxDISABLE is asserted and the ER command begins a downward ramp from set point to zero or some other minimum. At time $T_2$, before the downward ramp of ER command has been completed, the Tx power command begins its ramp downward from set point to zero. At time $T_3$, the ER command ramp has been completed but the Tx power command ramp is still proceeding and does not complete until time T4. Thus, the ER command ramp begins before the TX power command ramp and reaches minimum before the TX power command ramp reaches minimum.

Of course, various other effects can be achieved by adjusting the slope of one or both of the ramps. For example, by decreasing the slope of the ER command ramp, the ER command ramp can be figured to begin before the Tx power command ramp and end at some point after the Tx power command ramp has been completed. As another example, in a variation on FIG. 5B, the ER command ramp and Tx power command ramps can be set to begin at the same time but terminate at different times. A variety of other arrangements may be implemented as well.

With continuing reference to FIG. 5C, both ER command and Tx power command remain at zero or some other minimum from time $T_4$ until TxDISABLE is deasserted at time $T_5$. A time delay then occurs between time $T_5$ and time $T_6$. In some implementations however, no time delay is imposed. At the end of the time delay at time $T_6$, the Tx power command begins to ramp up from zero to the set point. At time $T_7$, before the Tx power command ramp is complete, the ER command likewise begins to ramp upward from zero to the set point. The ER command ramp continues until time $T_8$, while the ER command ramp does not complete until time $T_9$. Once both Tx power command and the ER command have reach their respective set points, the Tx power command and ER command remain at those set points until another assertion of TxDISABLE.

Thus, FIG. 5C graphically depicts a situation where the Tx power command and ER command ramps overlap each other by some period of time. In the exemplary illustrated case, this overlap occurs both at TxDISABLE assertion as well as at TxDISABLE deassertion. As with the other control schemes and processes disclosed herein however, the case illustrated in FIG. 5C is exemplary only and is not intended to limit the scope of the invention in any way.

The described embodiments are to be considered in all respects only as exemplary and not restrictive. The scope of the invention is, therefore, indicated by the appended claims rather than by the foregoing description. All changes which come within the meaning and range of equivalency of the claims are to be embraced within their scope.

What is claimed is:

1. A method for controlling an optical transmitter, the method comprising:
   changing a laser bias to the optical transmitter from a first laser bias level to a second laser bias level in accordance with a laser bias control scheme; and
   changing an electrical modulation amplitude of an optical signal associated with the optical transmitter from a first value to a second value in accordance with an electrical modulation amplitude control scheme,
   wherein the laser bias control scheme and/or the electrical modulation amplitude control scheme include a ramp function; and
   wherein the electrical modulation amplitude control scheme is defined such that changing the electrical modulation amplitude to the optical transmitter from a first value to a second value comprises one of: changing the electrical modulation amplitude to the optical transmitter from a minimum to a setpoint; or, changing the electrical modulation amplitude to the optical transmitter from a setpoint to a minimum.

2. The method as recited in claim 1, wherein the laser bias control scheme and electrical modulation amplitude control scheme are defined such that at least a portion of the electrical modulation amplitude change is implemented at a different time than implementation of the laser bias change.

3. The method as recited in claim 1, wherein the laser bias control scheme and the electrical modulation amplitude control scheme are defined such that the electrical modulation amplitude change is implemented at substantially the same time as implementation of the laser bias change.

4. The method as recited in claim 1, wherein the laser bias control scheme and the electrical modulation amplitude control scheme are defined such that a substantial portion of the laser bias change is implemented prior to implementation of a substantial portion of the electrical modulation amplitude change.

5. The method as recited in claim 1, wherein the electrical modulation amplitude control scheme and laser bias control scheme are defined such that a substantial portion of the electrical modulation amplitude change is implemented prior to implementation of a substantial portion of the laser bias change.

6. The method as recited in claim 1, wherein the laser bias control scheme is defined such that at least a portion of the change to the laser bias is implemented linearly with respect to time.

7. The method as recited in claim 1, wherein the laser bias control scheme is defined such that at least a portion of the change to the laser bias is implemented non-linearly with respect to time.

8. The method as recited in claim 1, wherein the electrical modulation amplitude control scheme is defined such that at least a portion of the change to the electrical modulation amplitude is implemented linearly with respect to time.

9. The method as recited in claim 1, wherein the electrical modulation amplitude control scheme is defined such that at least a portion of the change to the electrical modulation amplitude is implemented non-linearly with respect to time.

10. The method as recited in claim 1, wherein the laser bias control scheme is defined such that changing the power to the optical transmitter from a first laser bias level to a second laser bias level comprises one of changing the power to the optical transmitter from a minimum to a setpoint; or, changing the power to the optical transmitter from a setpoint to a minimum.

11. The method as recited in claim 1, wherein the laser bias control scheme and the electrical modulation amplitude control scheme are respectively defined such that the laser bias change and the electrical modulation amplitude change are implemented in response to the occurrence of a predetermined event.

12. The method as recited in claim 11, wherein the predetermined event comprises assertion of an optical transmitter disable signal.

13. The method as recited in claim 11, wherein the predetermined event comprises deassertion of an optical transmitter disable signal.

14. A method for controlling an optical transmitter, the method comprising:
performing the following during a first predetermined time slot:
changing a laser bias to the optical transmitter from a first laser bias level to a second laser bias level in accordance with a laser bias control scheme; and
changing an electrical modulation amplitude of an optical signal associated with the optical transmitter from a first value to a second value in accordance with an electrical modulation amplitude control scheme,
wherein the laser bias control scheme and/or the electrical modulation amplitude control scheme include a ramp function; and
performing the following during a second predetermined time slot:
changing a laser bias to the optical transmitter from a first laser bias level to a second laser bias level in accordance with a laser bias control scheme; and
changing an electrical modulation amplitude of an optical signal associated with the optical transmitter from a first value to a second value in accordance with an electrical modulation amplitude control scheme,
wherein the laser bias control scheme and/or the electrical modulation amplitude control scheme include a ramp function.

15. The method as recited in claim 14, wherein the first predetermined time slot is proximate in time to startup of the optical transmitter, and wherein the second predetermined time slot is proximate in time to shutdown of the optical transmitter.

16. The method as recited in claim 14, wherein the laser bias control scheme and electrical modulation amplitude control scheme are respectively defined such that in the first predetermined time slot, a substantial portion of the laser bias change is implemented prior to implementation of a substantial portion of the electrical modulation amplitude change, and wherein in the second predetermined time slot, a substantial portion of the electrical modulation amplitude change is implemented prior to implementation of a substantial portion of the laser bias change.

17. The method as recited in claim 14, wherein in the first predetermined time slot, the first laser bias level comprises a minimum and the second laser bias level comprises a setpoint, and wherein in the second predetermined time slot, the first laser bias level comprises a setpoint and the second laser bias level comprises a minimum.

18. The method as recited in claim 14, wherein in the first predetermined time slot, the first value of the electrical modulation amplitude comprises a minimum and the second value of the electrical modulation amplitude comprises a setpoint, and wherein in the second predetermined time slot, the first value of the electrical modulation amplitude comprises a setpoint and the second value of the electrical modulation amplitude comprises a minimum.

19. The method as recited in claim 14, wherein, in both the first and second predetermined time slots, at least a portion of the change to the laser bias is implemented linearly with respect to time.

20. The method as recited in claim 14, wherein the electrical modulation amplitude control scheme is defined such that in both the first and second predetermined time slots, at least a portion of the change to the electrical modulation amplitude is implemented linearly with respect to time.

21. The method as recited in claim 14, wherein the laser bias control scheme is defined such that in both the first and second predetermined time slots, a substantial portion of the laser bias change is implemented linearly with respect to time.

22. The method as recited in claim 1, wherein the ramp function includes a predetermined gradual change in the laser bias and/or modulation as a function of time.

23. The method as recited in claim 1, wherein the ramp function includes a linear predetermined gradual change in the laser bias and/or modulation as a function of time and a non-linear predetermined gradual change in the laser bias and/or modulation as a function of time.

24. A method for controlling an optical transmitter, the method comprising:
changing a laser bias to the optical transmitter from a first laser bias level to a second laser bias level in accordance with a laser bias control scheme; and
changing an electrical modulation amplitude of an optical signal associated with the optical transmitter from a first value to a second value in accordance with an electrical modulation amplitude control scheme,
wherein the laser bias control scheme and/or the electrical modulation amplitude control scheme include a ramp function; and
wherein the ramp function is associated with a first slope of a first linear portion of the ramp function and a second slope of a second linear portion of the ramp function.

25. The method as recited in claim 1, wherein the laser bias control scheme and/or the electrical modulation amplitude control scheme include a second ramp function, wherein the ramp functions are associated with different slopes.

26. The method of claim 2, wherein the laser bias control scheme and the electrical modulation amplitude control scheme are defined such that a portion of the electrical modulation amplitude change is implemented at substantially the same time as implementation of the laser bias change.

27. The method as recited in claim 6, wherein the laser bias control scheme is defined such that a portion of the change to the laser bias is implemented non-linearly with respect to time.

28. The method as recited in claim 8, wherein the electrical modulation amplitude control scheme is defined such that a portion of the change to the electrical modulation amplitude is implemented non-linearly with respect to time.

* * * * *

UNITED STATES PATENT AND TRADEMARK OFFICE
CERTIFICATE OF CORRECTION

PATENT NO.        : 7,418,015 B2                                                Page 1 of 1
APPLICATION NO.   : 10/784565
DATED             : August 26, 2008
INVENTOR(S)       : Lucy G. Hosking It is certified that error appears in the above-identified patent and that said Letters Patent is hereby corrected as shown below:

Column 1
Line 31, change "basic components such as" to --basic components, such as--

Column 5
Line 55, change "and other, aspects of" to --and other aspects of--

Column 7
Line 64, change "by the TOSA. The optical data signal generated by the TOSA" to --by the TOSA 500. The optical data signal generated by the TOSA 500--

Column 8
Line 7, change "the TOSA," to --the TOSA 500,--
Line 8, change "the TOSA." to --the TOSA 500.--
Line 18, change "from a customer." to --from the host equipment 600.--
Line 25, change "customer host equipment 600," to --host equipment 600,--

Column 20
Line 5, change "sign wave" to --sine wave--

Column 21
Line 9, change "T4." to --$T_4$.--
Line 31, change "T4." to --$T_4$.--
Line 54, change "ER command ramp" to --TxPower command ramp--

Signed and Sealed this

Twenty-third Day of February, 2010

David J. Kappos
*Director of the United States Patent and Trademark Office*